(12) United States Patent
Chee

(10) Patent No.: US 6,657,133 B1
(45) Date of Patent: Dec. 2, 2003

(54) BALL GRID ARRAY CHIP CAPACITOR STRUCTURE

(75) Inventor: Soon S. Chee, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 85 days.

(21) Appl. No.: 09/858,763

(22) Filed: May 15, 2001

(51) Int. Cl.[7] .............................................. H05K 1/16
(52) U.S. Cl. ...................... 174/260; 174/261; 174/262; 174/266; 361/760; 361/763; 361/807; 361/777; 257/738; 257/698
(58) Field of Search ................................ 174/260, 261, 174/262, 263, 266; 361/760, 763, 764, 766, 782, 783, 807, 774, 777; 257/737, 738, 778, 696

(56) References Cited

U.S. PATENT DOCUMENTS

| 5,425,647 | A | * | 6/1995 | Mencik et al. ................. 439/83 |
| 5,798,563 | A | * | 8/1998 | Feilchenfeld et al. ......... 257/668 |
| 5,808,873 | A | * | 9/1998 | Celaya et al. ................. 257/676 |
| 5,866,942 | A | * | 2/1999 | Suzuki et al. ................. 257/698 |
| 6,064,114 | A | * | 5/2000 | Higgins, III .................. 257/698 |
| 6,316,736 | B1 | * | 11/2001 | Jairazbhoy .................... 174/260 |
| 6,369,443 | B1 | * | 4/2002 | Baba ........................... 257/697 |
| 6,384,344 | B1 | * | 5/2002 | Asai et al. .................... 174/260 |

FOREIGN PATENT DOCUMENTS

| JP | 10209327 A | * | 8/1998 |
| JP | 2000349225 | * | 12/2000 |
| JP | 2001035952 | * | 2/2001 |
| JP | 02001044318 A | * | 2/2001 |

* cited by examiner

Primary Examiner—Kamand Cuneo
Assistant Examiner—I B Patel
(74) Attorney, Agent, or Firm—Patrick T. Bever; LeRoy D. Maunu; Edel M. Young

(57) ABSTRACT

A BGA-type capacitor structure including a conventional chip capacitor mounted on the upper surface of an inexpensive substrate, and having solder balls mounted on a lower surface of the substrate. Lands that are required to mount the chip capacitor are formed on the substrate, which is offset from the surface of a PCB by the solder balls. The substrate can be a thin sheet of polyimide tape that is etched or perforated to provide holes through which the solder balls contact the lands used to mount the chip capacitor. An assembly incorporating the BGA capacitor structure includes a PCB having an array of metal vias extending between opposing upper and lower surfaces, a BGA IC mounted on the upper surface and soldered to first ends of the metal vias. The capacitor structures are soldered to contact pads formed on the lower surface of the PCB.

13 Claims, 4 Drawing Sheets

BALL GRID ARRAY CHIP CAPACITOR STRUCTURE

FIELD OF THE INVENTION

This invention relates to integrated circuits (ICs), and more particularly to a decoupling capacitor structure for use with fine-pitched Ball Grid Array (BGA) packaged ICs.

BACKGROUND OF THE INVENTION

Integrated circuits (ICs) require a power supply voltage that is connected to a power supply lead of the IC through a power supply interconnection (e.g., a conductive trace formed on a printed circuit board (PCB) hosting both the IC and the power supply). This power supply interconnection can be a source of emitted or received electromagnetic interference (EMI). For example, EMI can be emitted through the power supply interconnection in response to high frequency electronic signals operating within the IC. Similarly, externally generated EMI can be received through the power supply interconnection, which acts as an antenna, that can affect the operation of the electronic circuitry within the IC.

The amount of EMI generated in a power supply interconnection is generally dependent upon the physical distance between the power supply lead of the IC and a decoupling capacitor electrically connected to the power supply lead. Therefore, EMI can be reduced by minimizing the length of the power supply interconnection between the decoupling capacitor and the power supply lead of the IC.

FIG. 1 is a perspective view showing a conventional chip capacitor 100, which is representative of a class of low-cost decoupling capacitors used to minimize EMI in electronic systems. Chip capacitors are well-known surface mount device constructed according to subsection 8.2 of the Surface Mount Design and Land Pattern Standard published by the Institute for Interconnecting and Packaging Electronic Circuits (IPC-SM-782, May 1996, Revision A). Chip capacitor 100 includes a box-shaped housing 110, and has a first terminal 112 and a second terminal 114 located at opposite ends of housing 110. Terminals 112 and 114 are constructed to facilitate soldering to lands 122 and 124 that are provided, for example, on a PCB 210. Lands 122 and 124 are also specified in subsection 8.2 of the Surface Mount Design and Land Pattern Standard (cited above), and are typically connected by conductive traces to corresponding metal vias 211-1 and 211 (FIG. 2(A)) formed on PCB 210 according to known techniques.

FIGS. 2(A) and 2(B) are bottom plan and side cross-sectional views showing an assembly 200 in which a ball-grid array (BGA) packaged IC 220 is mounted on PCB 210 (partially shown in FIG. 1), and includes several conventional chip capacitors 100 that are provided to minimize EMI. BGA IC 220 includes an array of solder balls 221 that extend from a lower surface of a package substrate 222 and are soldered to corresponding contact pads formed on metal vias 211. Mounted on package substrate 222 is an IC chip 224 that is electrically connected to solder balls 221, and is protected by a cover (e.g., a "glob top") 226. PCB 210 includes an array of metal vias 211 whose pitch (i.e., distance between adjacent vias) is determined by the corresponding pitch of solder balls 221 on BGA IC 220.

Referring to FIG. 2(A), when metal vias 211 are arranged close together to accommodate the fine pitch of solder balls 221, chip capacitors 100 must be arranged around the periphery P of the metal via array. As mentioned above, each chip capacitor requires a pair of lands (e.g., lands 122 and 124, which are shown in FIG. 1) of a specified size, and there is insufficient space between metal vias 211 to form these lands. Accordingly, chip capacitors 100 must be located outside of periphery P, which can result in increased EMI when one or more power supply leads are soldered to metal vias located in central region C of the metal via array. This is particularly true when two or more rows of chip capacitors 100 must be formed around periphery P.

Several conventional solutions are possible to address the problem of locating one or more chip capacitors in central region C of the metal via array shown in FIG. 2(A). First, the arrangement of solder balls 221 and/or metal vias 211 can be changed to provide the necessary space. However, this solution requires a costly re-design of standard BGA packages and/or the non-use of one or more leads on IC 220. Another solution may be to redesign the chip capacitor to fit within the narrow spaces provided between metal vias. Again, this solution requires an expensive redesign of the chip capacitor housing, which would greatly increase the cost of the chip capacitors.

What is needed is a capacitor structure that can be used as a decoupling capacitor and avoids the space requirement problems associated with convention chip capacitors (discussed above). Further, what is needed is a capacitor structure that has the low per-piece cost of conventional chip capacitors.

SUMMARY OF THE INVENTION

The present invention is directed to a BGA-type capacitor structure including a conventional chip capacitor mounted on the upper surface of an inexpensive substrate (e.g., polyimide tape), and having solder balls mounted on a lower surface of the substrate. Lands that are required to mount the chip capacitor are formed on the substrate, which is offset from the surface of a PCB by the solder balls. Accordingly, the capacitor structures of the present invention are easily integrated into a metal via array, thereby minimizing the spacing between the chip capacitor mounted thereon and a power supply lead of an integrated circuit also mounted on the PCB. Further, the size of the substrate is easily changed to accommodate a wide range of metal via pitches, thereby allowing the use of inexpensive conventional chip capacitors and avoiding costly redesigns.

In one embodiment of the present invention, the substrate is a thin sheet of polyimide tape that is etched or perforated to provide holes through which the solder balls contact the lands used to mount the chip capacitors.

The present invention is also directed to an assembly including a PCB having an array of metal vias extending between opposing upper and lower surfaces, a BGA IC mounted on the upper surface and soldered to first ends of the metal vias, and one or more capacitor structures soldered to contact pads formed on the lower surface of the PCB. Each capacitor structure includes the features described above. Each of the contact pads is connected by a conductive trace to the second ends of one or more associated metal vias, thereby minimizing the distance between the chip capacitor mounted on the capacitor structure and power supply leads formed on the BGA IC.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 3:
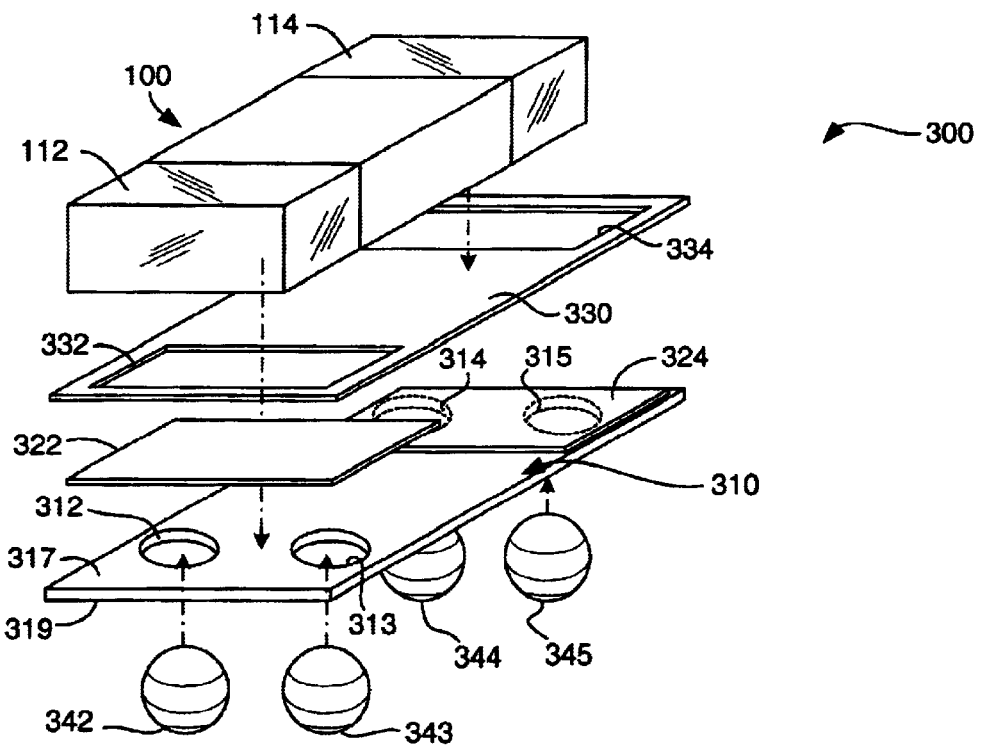
FIG. 3 is an exploded perspective view showing a capacitor structure according to an embodiment of the present invention.

FIG. 3 is an exploded perspective view showing a ball-grid array (BGA) capacitor structure 300 according to an embodiment of the present invention. BGA capacitor structure 300 generally includes a base 310, a conventional chip capacitor 100 (described above), and four solder balls 342–345.

Base 310 is a thin sheet of insulating material (e.g., polyimide tape having a thickness of 3 mils) that defines four through holes 312–315 passing between an upper surface 317 an a lower surface 319. As discussed below, through holes 312–315 are provided to facilitate electrical connection between chip capacitor 100 and solder balls 342–345. In other embodiments, this electrical connection can be facilitated using a conductor that extends around the edge of base 310. When base 310 is formed from polyimide tape, automated production is facilitated by forming multiple BGA capacitor structures 300 on an elongated strip, and then cutting the strip to separate the individual BGA capacitor structures 300 using known production techniques.

Figure 4:
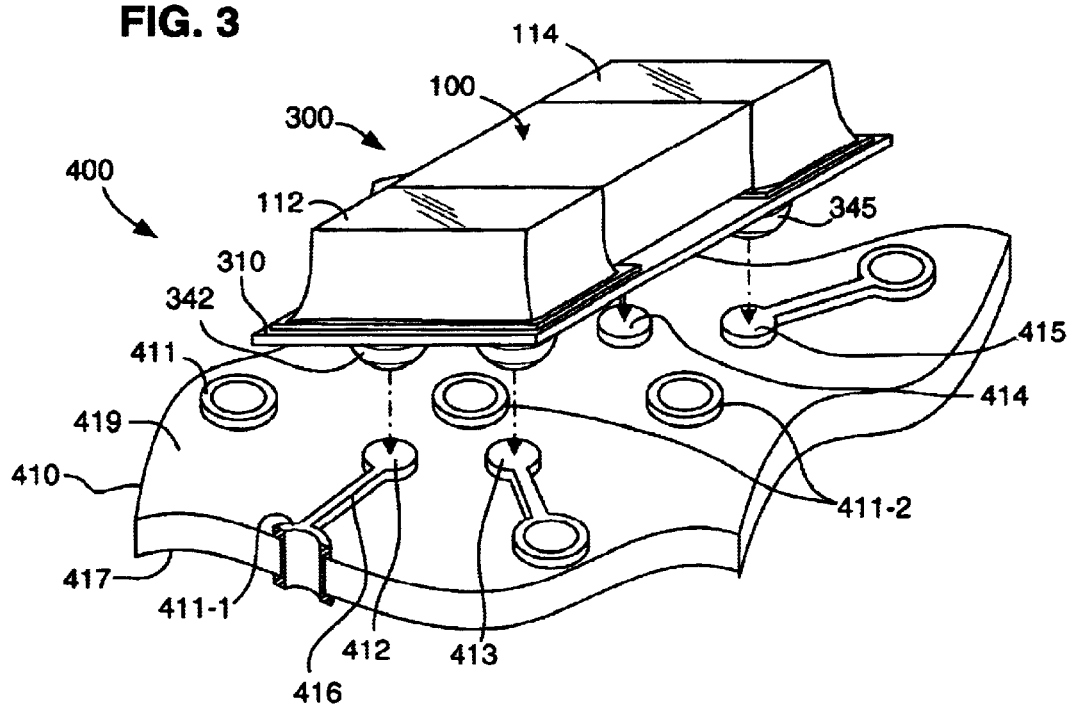
FIG. 4 is an exploded perspective view showing an assembly including the capacitor structure shown in FIG. 3.

A first land (conductive pad) 322 and a second land (conductive pad) 324 are formed on upper surface 317 of base 310 to provide lands for base 310. These lands are formed from a conductive material (e.g., copper) using known techniques, and have a size set forth by IPC-SM-782 standards (discussed above). As indicated in FIG. 3, first land 322 is located over through holes 312 and 313, and second land 324 is located over through holes 314 and 315. Referring briefly to FIG. 4, when fully assembled, chip capacitor 100 is mounted such that first terminal 112 is mounted on first conductive pad 322, and second terminal 114 mounted on second conductive pad.

Referring again to FIG. 3, an optional solder mask 330 is provided between upper surface 317 of base 310 and chip capacitor 110 using known techniques and materials. Solder mask defines a first opening 332 through which first terminal 112 contacts first land 322, and a second opening 334 through which second terminal 114 contacts second land 324.

Referring to the lower portion of FIG. 3, solder balls 342–345 are mounted on lower surface 319 of base 310 such that they are electrically connected to lands 322 and 324. Specifically, solder balls 322 and 323 extend through through holes 312 and 313 of base 310 to contact land 322, and solder balls 324 and 325 extend through through holes 314 and 315 of base 310 to contact land 324. Although four solder balls are utilized in the embodiment shown in FIG. 3, the number of solder balls is not limited to this number.

FIG. 4 is an exploded perspective view showing an assembly 400 including a PCB 410 that includes a series of metal vias 411 and four contact pads 412–415 for receiving solder balls 342–345 of BGA capacitor structure 300. Metal vias are well-known structures used to pass signals between opposing surfaces and one or more intermediate conductive layers of a PCB. Referring to the lower portion of FIG. 4, metal via 411-1 is shown in cross-section, and includes a metal (e.g., copper) sleeve that passes between a first surface 417 and a second surface 419 of PCB 410. Metal vias 411 are formed by drilling holes through PCB 410, and then coating the holes to form the metal sleeves or vias. Similarly, contact pads 412–415 are formed from metal (e.g., copper) tracing that is etched using known PCB fabrication techniques. Each contact pad is connected to at least one metal via 411. For example, contact pad 412 is connected to metal via 411-1 by a trace line 416.

Figure 1:
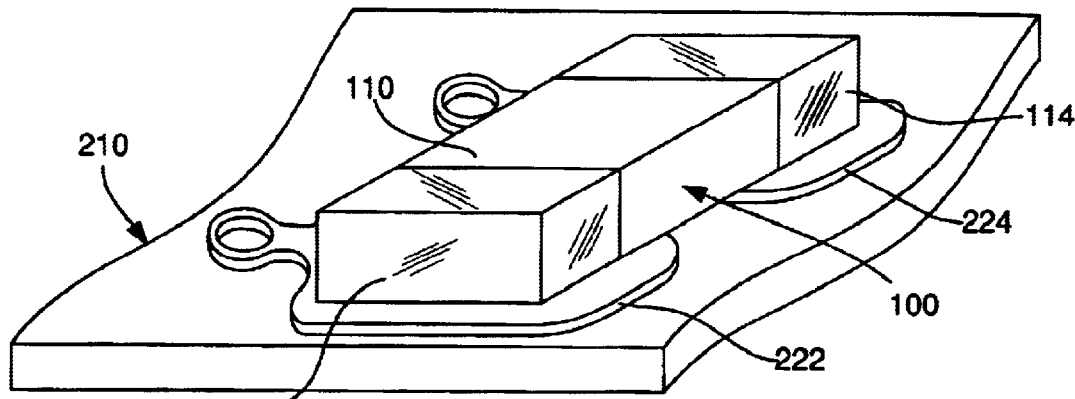
FIG. 1 is a perspective view showing a conventional chip capacitor.
Figure 2A:
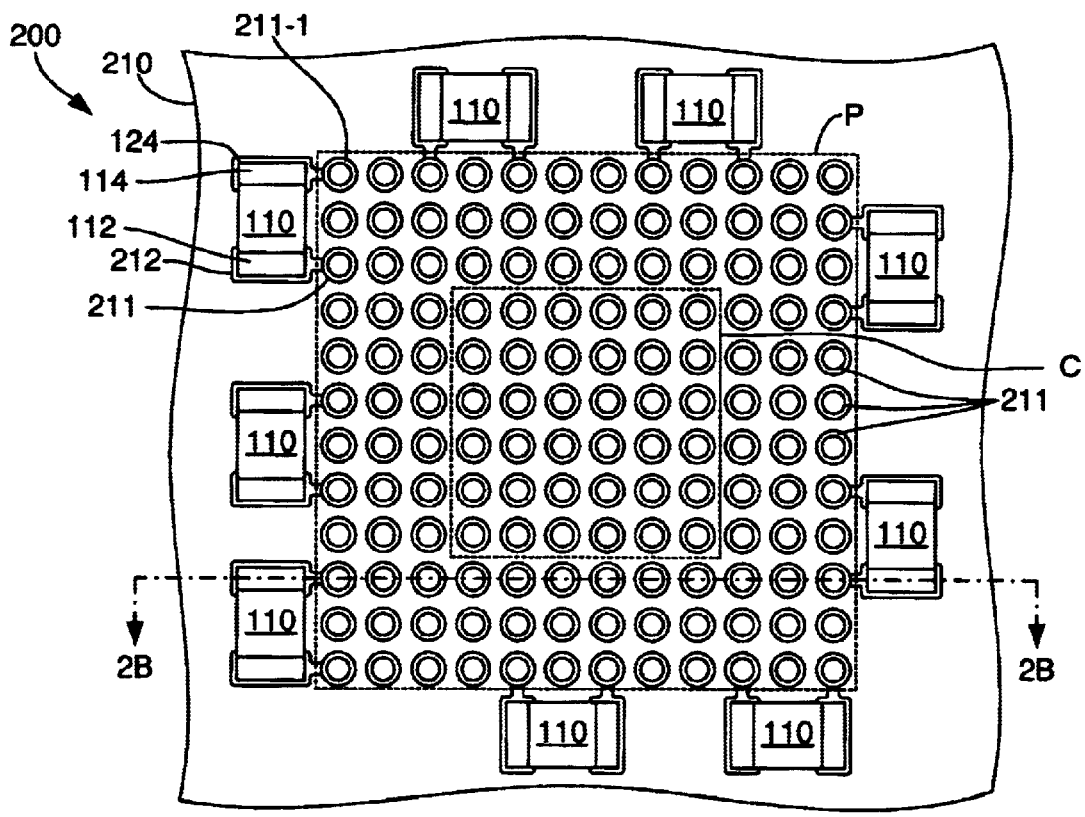
FIGS. 2(A) and 2(B) are bottom plan and cross-sectional side views showing a conventional assembly including a BGA IC and several chip capacitors.
Figure 2B:
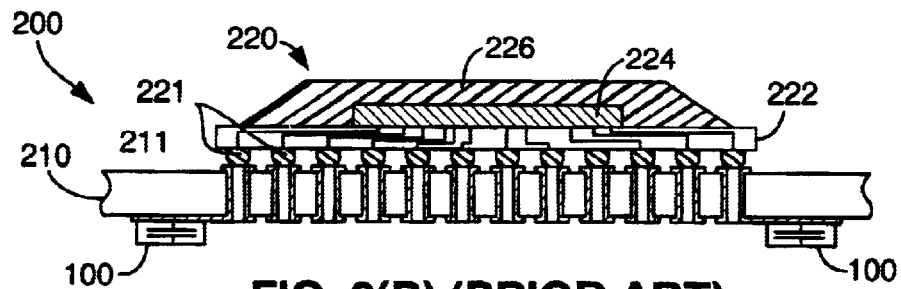

According to the present invention, BGA capacitor structure 300 avoids the spacing problems associated with the conventional chip capacitor arrangement (described with reference to FIGS. 1, 2(A) and 2(B), above) in that by mounting chip capacitor 100 on base 310, and then mounting base 310 onto contact pads 412–415 of PCB 410 using solder balls 342–345, chip capacitor 100 can be mounted over metal vias 411 without making electrical contact. Specifically, base 310 forms a bridge or platform that is separated from surface 419 of PCB 400 and supported by solder balls 342–345. Accordingly, one or more metal vias (e.g., metal vias 411-2) can be located under base 310 without being electrically connected to chip capacitor 100. As discussed in additional detail below, this feature facilitates locating chip capacitors at a minimum distance from an IC, thereby minimizing EMI.

In addition, BGA capacitor structure 300 is produced at a minimal cost by utilizing existing chip capacitor 100 and an inexpensive base 310 (e.g., polyimide tape). Inexpensive chip capacitor 100 can be mounted onto any of a wide range of bases 310 having various sizes to accommodate different BGA pitches, thereby avoiding the expense of producing different sizes of capacitor packages suited for the different BGA pitches.

Figure 5A:
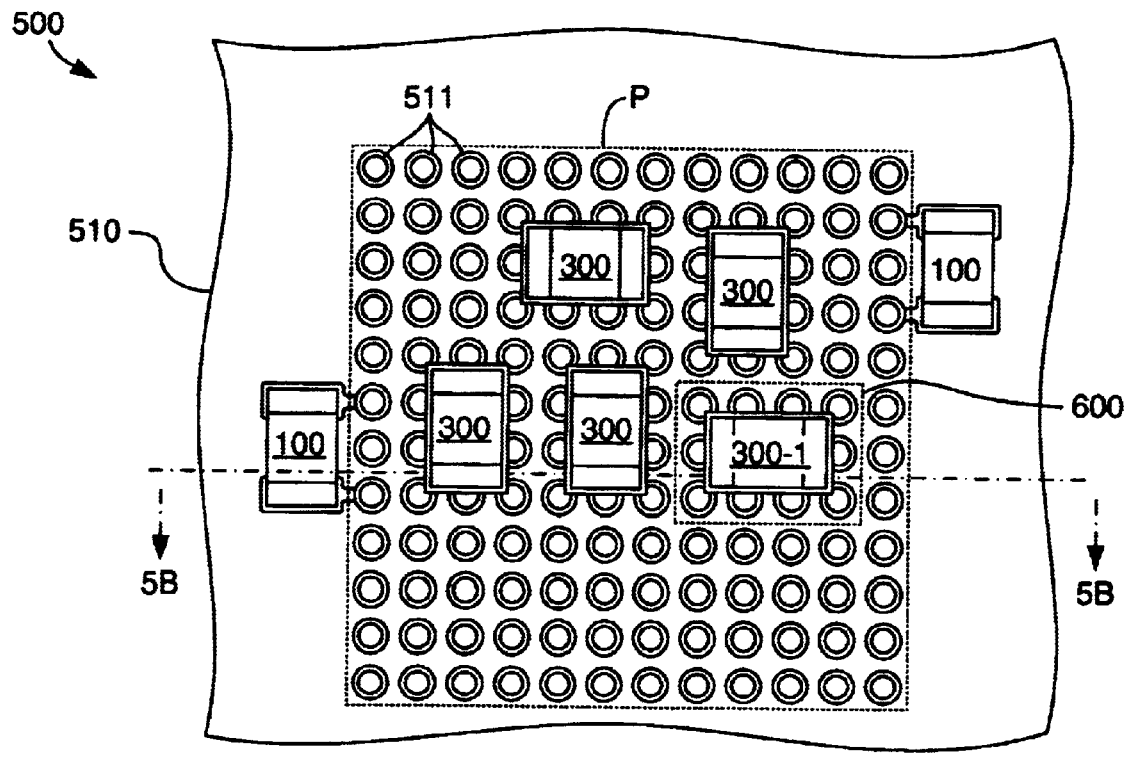
FIGS. 5(A) and 5(B) are bottom plan and cross-sectional side views showing the assembly of FIG. 4 in additional detail.
Figure 5B:
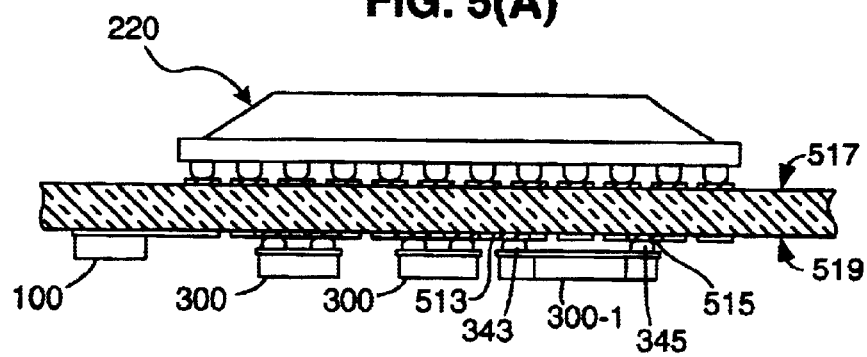

FIGS. 5(A) and 5(B) are bottom and cross-section views, respectively, showing an assembly 500 in accordance with a third embodiment of the present invention. Assembly 500 includes a PCB 510 having an array of finely pitched metal vias 511 extending between opposing upper and lower surfaces 517 and 519. Mounted on upper surface 517 of PCB 510 is BGA IC 220, which is described in the background section (above), and mounted on lower surface 519 of PCB 510 are several BGA capacitor structures 300, as well as several conventional chip capacitors 100. Note that, unlike the peripherally-mounted conventional chip capacitors 100, BGA capacitor structures 300 are mounted at selected locations within the periphery P of the array of metal vias 511. Accordingly, BGA capacitor structures 300 minimize EMI by minimizing the distance between the chip capacitor mounted thereon and power pins of BGA IC 220 that are located near the center of the array. As indicated in FIG. 5(B), each capacitor structure 300 is mounted on associated contact pads formed on lower surface 519. For example, solder balls 343 and 345 of capacitor structure 300-1 are mounted on contact pads 513 and 515, respectively.

Figure 6A:
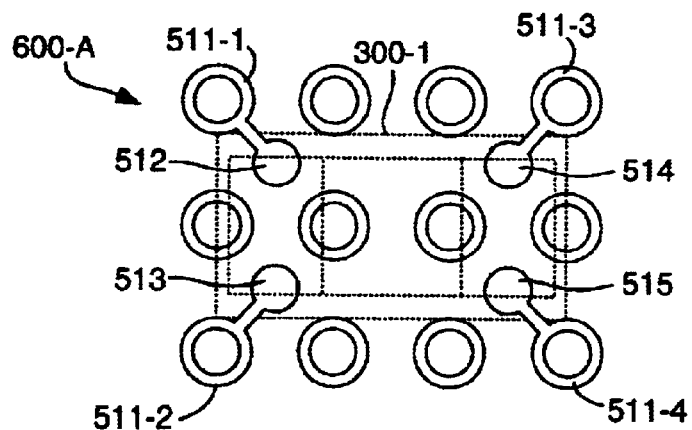
FIGS. 6(A), 6(B), 6(C), and 6(D) are plan views showing various contact pad structures formed on a PCB of the assembly shown in FIGS. 5(A) and 5(B).
Figure 6B:
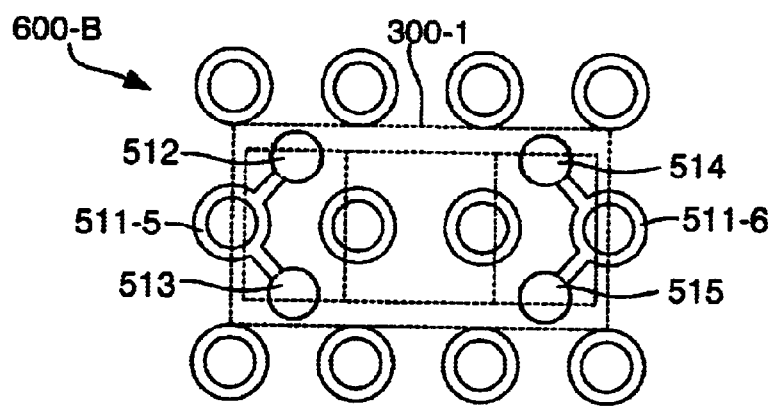
Figure 6C:
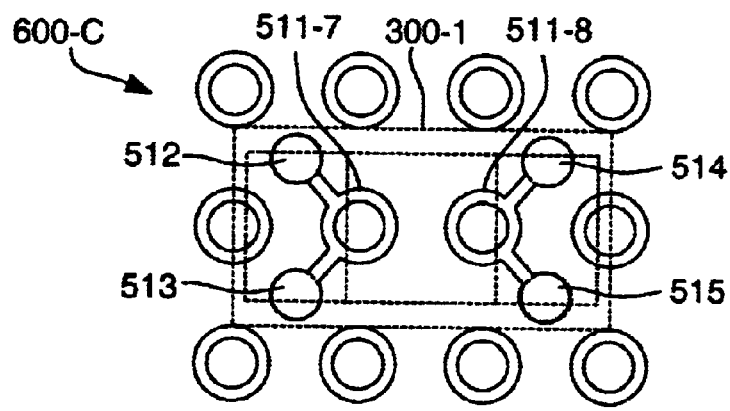
Figure 6D:
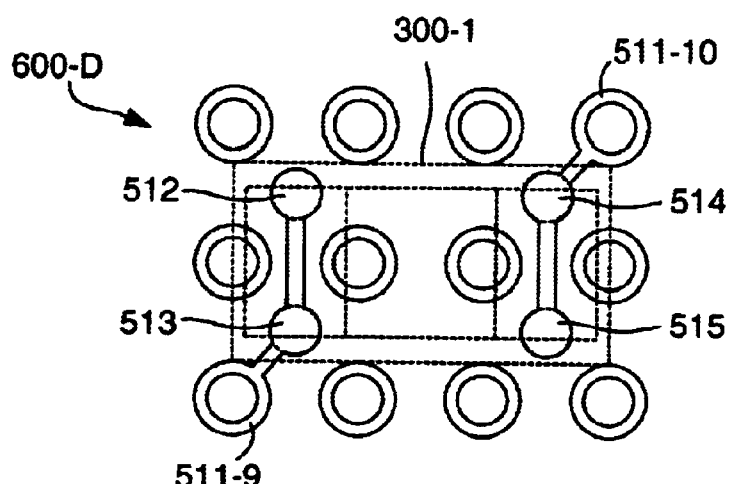

FIGS. 6(A) through 6(D) are plan views showing various contact pad structures formed on PCB 510 for mounting capacitor structure 300-1 (shown in FIGS. 5(A) and 5(B)). In each of these figures, BGA capacitor structure 300-1 indicated in dashed lines to clearly show the connections between the contact pads and associated metal vias. FIG. 6(A) shows a first arrangement 600-A in which each of four contact pads 512 through 515 are connected by conductive trace to an associated metal via 511-1 through 511-4. FIG. 6(B) shows a second arrangement 600-B in which both of contact pads 512 and 513 are connected by conductive traces to a single metal via 511-5, and contact pads 514 and 515 are connected by conductive traces to a single metal via 511-6. FIG. 6(C) shows a third arrangement similar to that shown in FIG. 6(B), where contact pads 512 and 513 are connected to a metal via 511-7 and contact pads 514 and 515 are connected to a metal via 511-8, and where metal vias 511-7 and 511-8 are adjacent to each other and located between the pairs of contact pads. Finally, FIG. 6(D) shows a fourth arrangement 600-D in which contact pad 513 is connected between contact pad 512 and a metal via 511-9, and contact pad 514 is connected between contact pad 515 and a metal via 511-10.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A ball-grid array (BGA) capacitor structure for mounting on a printed circuit board having a plurality of metal vias and a plurality of contact pads respectively connected to selected vias, comprising:
a base having an upper surface and including first and second spaced-apart conductive pads formed on the upper surface;
a chip capacitor having a first terminal mounted on the first conductive pad and a second terminal mounted on the second conductive pad; and
a plurality of solder balls mounted on a lower surface of the base, the plurality of solder balls including a first solder ball electrically connected to the first conductive pad through a vertically extending through-hole and a second solder ball electrically connected to the second conductive pad through a vertically extending through-hole, wherein the first and second solder balls are aligned for connection to respective ones of the plurality of contact pads and further comprising a third solder ball electrically connected to the first conductive pad and a fourth solder ball electrically connected to the second conductive pad.

2. The BGA capacitor structure according to claim 1, wherein the base comprises polyimide tape.

3. The BGA capacitor structure according to claim 1, wherein the base defines a plurality of through holes including a first through hole through which the first solder ball contacts the first conductive pad, and a second through hole through which the second solder ball contacts the second conductive pad.

4. The BGA capacitor structure according to claim 1, further comprising a solder mask provided between the upper surface of the base and the chip capacitor, wherein the solder mask defines a first opening through which the first terminal of the chip capacitor contacts the first conductive pad, and a second opening through which the second terminal of the chip capacitor contacts the second conductive pad.

5. An assembly comprising:
printed circuit board including a plurality of metal vias and a plurality of contact pads each contact pad being electrically connected to at least one of the metal vias; and
a bull-grid array (BGA) capacitor structure including:
a base having an upper surface and including first and second spaced-apart conductive pads formed on the upper surface;
a chip capacitor having a first terminal mounted on the first conductive pad and a second terminal mounted on the second conductive pad; and
a plurality of solder balls mounted between the printed circuit board and a lower surface of the base, the plurality of solder balls including a first solder ball electrically connected between a first contact pad of the plurality of contact pads and the first conductive pad, and a second solder ball electrically connected between a second contact pad of the plurality of contact pads the second conductive pad, and
wherein the printed circuit board further includes a third contact pad and a fourth contact pad, and
wherein the plurality of solder balls further comprises a third solder ball connected between the first conductive pad and the third contact pad, and a fourth solder ball connected between the second conductive pad and the fourth contact pad.

6. The assembly according to claim 5, wherein each of the first, second, third, and fourth contact pads are connected by associated conductive traces to first, second, third, and fourth metal vias.

7. The assembly according to claim 5, wherein the first and third contact pads are connected by associated conductive traces to a first metal via, and the second and fourth contact pads are connected by associated conductive traces to a second metal via.

8. The assembly according to claim 7, wherein the first, second, third, and fourth contact pads are located between the first metal via and the second metal via.

9. The assembly according to claim 7, wherein the first metal via and the second metal via are located within a perimeter formed by the first, second, third, and fourth contact pads.

10. The assembly according to claim 7, wherein the third contact pad is connected between the first contact pad and the first metal via, and the second contact pad is connected between the fourth contact pad and the second metal via.

11. The assembly according to claim 5, wherein the base of the BGA capacitor structure comprises polyimide tape.

12. The assembly according to claim 5, wherein the base defines a plurality of through holes including a first through hole through which the first solder ball contacts the first conductive pad, and a second through hole through which the second solder ball contacts the second conductive pad.

13. The assembly according to claim 5, wherein the BGA capacitor structure further comprising a solder mask provided between the upper surface of the base and the chip capacitor, wherein the solder mask defines a first opening through which the first terminal of the chip capacitor contacts the first conductive pad, and a second opening through which the second terminal of the chip capacitor contacts the second conductive pad.

\* \* \* \* \*